US009335383B2

(12) United States Patent
Fukasawa et al.

(10) Patent No.: US 9,335,383 B2
(45) Date of Patent: May 10, 2016

(54) MAGNETIC FIELD GENERATING DEVICE AND OFFSET CALCULATING METHOD

(71) Applicant: AICHI STEEL CORPORATION, Tokai-shi (JP)

(72) Inventors: Masahiko Fukasawa, Aichi (JP); Masaaki Nakada, Aichi (JP); Ryuji Kambara, Aichi (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 0 days.

(21) Appl. No.: 14/539,440

(22) Filed: Nov. 12, 2014

(65) Prior Publication Data

US 2015/0145625 A1      May 28, 2015

(30) Foreign Application Priority Data

Nov. 27, 2013   (JP) ................................. 2013-245321

(51) Int. Cl.
*G01R 33/00* (2006.01)
*G01C 17/38* (2006.01)
*H01F 7/06* (2006.01)
*G01R 33/02* (2006.01)

(52) U.S. Cl.
CPC ................ *G01R 33/00* (2013.01); *G01C 17/38* (2013.01); *G01R 33/0206* (2013.01); *H01F 7/06* (2013.01)

(58) Field of Classification Search
CPC .... G01C 17/38; G01R 33/0206; G01R 33/00; H01F 7/06
See application file for complete search history.

(56) References Cited

U.S. PATENT DOCUMENTS

| 5,032,792 A * | 7/1991 | Wing .................... H01F 13/006 324/228 |
| 8,847,586 B2 * | 9/2014 | Suzuki ................... G01R 35/00 324/224 |
| 2007/0124097 A1 * | 5/2007 | Geck ....................... G01C 17/38 702/116 |
| 2007/0222441 A1 * | 9/2007 | Satoh ..................... G01R 33/04 324/253 |
| 2013/0307547 A1 | 11/2013 | Honkura et al. |

FOREIGN PATENT DOCUMENTS

| JP | 2008-241675 | 10/2008 |
| JP | 2012-168140 | 9/2012 |

* cited by examiner

*Primary Examiner* — Mohamad Musleh
(74) *Attorney, Agent, or Firm* — Oblon, McClelland, Maier & Neustadt, L.L.P.

(57) ABSTRACT

A magnetic field generating device includes a triaxial Helmholtz coil 3, amounting table 4 on which a portable device 2 is mounted, a current supplying part 5 and a controlling part 6. The current supplying part 5 supplies current I to individual three monoaxial Helmholtz coils 30 which construct the triaxial Helmholtz coil 3. The controlling part 6 changes the current flowing through the individual monoaxial Helmholtz coils 30 in such a manner that a synthetic magnetic field of a magnetic field generated within the triaxial Helmholtz coil 3 by the current I and an external magnetic field which acts from the outside into the triaxial Helmholtz coil 3 acts on a triaxial magnetic sensor 20 within the portable device 2 mounted on the mounting table 4 from a plurality of predetermined directions.

8 Claims, 11 Drawing Sheets

MAGNETIC FIELD GENERATING DEVICE AND OFFSET CALCULATING METHOD

CROSS-REFERENCE TO RELATED APPLICATION

This application claims priority to Japanese patent application no. 2013-245321 filed on Nov. 27, 2013, the contents of which are entirely incorporated herein by reference.

BACKGROUND OF THE INVENTION

1. Field of the Invention

The present invention relates to a magnetic field generating device which generates a magnetic field acting on a portable device, and a method for calculating an offset of a triaxial magnetic sensor built in the portable device.

2. Description of the Related Art

As portable devices such as a cell phone and a tablet-type PC, those having the triaxial magnetic sensor built therein are known. The portable device detects a geomagnetic vector using the triaxial magnetic sensor and calculates the azimuth in which the portable device is directed using the detected value, and is configured to display the azimuth on its display part and to display map information in accordance with the direction thereof.

Many electronic components are mounted, in addition to the triaxial magnetic sensor, in the portable device. Therefore, the electronic components generate a magnetic field (internal magnetic field) within the portable device so that the detected values of the geomagnetic vector by the triaxial magnetic sensor are sometimes inaccurate. When the detected values of the triaxial magnetic sensor are inaccurate, the azimuth in which the portable device is directed cannot be accurately calculated. In order to solve this disadvantage, a method for correcting detection errors of the triaxial magnetic sensor caused by the internal magnetic field of the portable device has been developed.

In order to correct the detection errors, the following method, for example, is employed.

Upon change in posture of the portable device, the detected value of the geomagnetic vector by the triaxial magnetic sensor changes. As shown in FIG. 13, this detected value P would draw a sphere (hereinafter referred to as "azimuth sphere") within the triaxial orthogonal coordinate system (X, Y, Z) of the triaxial magnetic sensor along with the change in posture of the portable device. In the presence of the influences of the internal magnetic field, a center point O' of an azimuth sphere 9 does not coincide with an original point O of the triaxial orthogonal coordinate system. When the coordinates of the center point O' of the azimuth sphere 9 are calculated, the detected value (OP vector) of the triaxial magnetic sensor can be corrected by the following mathematical formula using a deviation (OO' vector) between the original point O of the triaxial orthogonal coordinate system and the center point O' of the azimuth sphere, thereby making it possible to obtain an accurate geomagnetic vector (O'P) which is not affected by the internal magnetic field and to calculate an accurate azimuth of the portable device.

[Mathematical Formula 1]

$$\overrightarrow{O'P} = \overrightarrow{OP} - \overrightarrow{OO'} \qquad \text{(Formula 1)}$$

For precise calculation of the center point O' of the azimuth sphere 9, namely, offset, it is necessary to conduct an operation of changing the direction of the portable device to the geomagnetism (hereinafter referred to also as "calibrating operation") to acquire detected values within a wide range on the azimuth sphere. However, such an operation is a burden on users, and thus, for example, attempts have been made to utilize a change in direction which naturally occurs when users use the portable device (for example, users take out the portable device from a pocket, or turn and walk in another direction) and to select detected values which are as far from each other as possible on the azimuth sphere from the obtained detected values to obtain the center point of the azimuth sphere (see JP 2008-241675 A and JP 2012-168140 A).

Patent Document 1: JP 2008-241675
Patent Document 2: JP 2012-168140

SUMMARY OF THE INVENTION

However, the offset calculating method as described above involves the problem that, since offset calculation is carried out after users have obtained a portable device, the respective users cannot calculate the azimuth until an offset can be calculated.

Therefore, in order to improve this point, there is a request for applying the calibrating operation to individual portable devices at portable device manufacturing factories in order to ship them in a state where the offset has been calculated. However, in this case, there arises a need to carry out the calibrating operation many times, which imposes a great burden on operators. Hence, it is difficult to apply such an operation to all of portable devices. Therefore, the portable devices are inevitably shipped without carrying out the calibrating operation, and there arises the problem that users, even when purchasing a new portable device, cannot know an accurate azimuth immediately after purchasing.

Also at development sites for programs for offset calculation, the calibrating operation is a great burden. Namely, in the development of a new program for offset calculation, it is necessary to have many people carry out the calibrating operation to confirm that whoever carries out the calibrating operation, the offset can be calculated accurately to a certain extent. This is because the way of the calibrating operation varies from person to person. However, if many people bear the calibrating operation for evaluation of the program each time a new program is developed, a great burden would be imposed on these people.

The present invention has been made in light of such background, and an object thereof is to provide an offset calculating method which can calculate an offset of a triaxial magnetic sensor without carrying out the calibrating operation and a magnetic field generating device which enables this method.

One aspect of the present invention resides in a magnetic field generating device which generates a magnetic field acting on a portable device, the portable device having a triaxial magnetic sensor which detects geomagnetism as a magnetic vector within a triaxial orthogonal coordinate system fixed on the portable device, and an offset calculating part which calculates a center point of an azimuth sphere drawn within the triaxial orthogonal coordinate system by the detected values of the geomagnetism along with a change in posture of the portable device, and the magnetic field generating device having:

a triaxial Helmholtz coil where three monoaxial Helmholtz coils through which current flows mutually independently are arranged in such a manner that the center axes of the respective coils are orthogonal to each other;

a mounting table which is provided within the triaxial Helmholtz coil and on which the portable device is mounted;

a current supplying part which supplies current to the individual monoaxial Helmholtz coils; and a controlling part which controls the current, wherein the controlling part is configured to change the current in such a manner that a synthetic magnetic field, which is synthesized a magnetic field generated by the current and an external magnetic field, acts on the triaxial magnetic sensor within the portable device mounted on the mounting table from a plurality of predetermined directions.

Another aspect of the present invention resides in a method for calculating an offset of a triaxial magnetic sensor provided in a portable device, the portable device having the triaxial magnetic sensor which detects geomagnetism as a magnetic vector within a triaxial orthogonal coordinate system fixed on the portable device, and an offset calculating part which calculates a center point of an azimuth sphere drawn within the triaxial orthogonal coordinate system by the detected values of the geomagnetism along with a change in posture of the portable device, and the method including:

a mounting step of mounting the portable device on a mounting table provided within the triaxial Helmholtz coil wherein three monoaxial Helmholtz coils through which current flows mutually independently are arranged in such a manner that the center axes of the respective coils are orthogonal to each other;

a current changing step of changing the current flowing through the individual monoaxial Helmholtz coils in such a manner that a synthetic magnetic field, which is synthesized a magnetic field generated by the current and an external magnetic field, acts on the triaxial magnetic sensor within the portable device mounted on the mounting table from a plurality of predetermined directions;

a detected value acquiring step of detecting the synthetic magnetic field whose direction changes during the current changing step by means of the triaxial magnetic sensor in order to acquire detected values of the synthetic magnetic field necessary for calculation of the offset; and a calculating step of calculating an offset by the offset calculating part using the obtained detected values of the synthetic magnetic field.

The magnetic field generating device and the offset calculating method utilize a change in direction of the synthetic magnetic field generated at the inside of the triaxial Helmholtz coil in place of the calibrating operation, namely, an operation of changing a relative direction of geomagnetism based on a portable device. Therefore, even without carrying out the calibrating operation, it is possible to generate a synthetic magnetic field which changes in various directions by the magnetic field generating device and to acquire detected values of the synthetic magnetic field necessary for offset calculation by the triaxial magnetic sensor within the portable device mounted within the magnetic field generating device.

In other words, the offset calculating method is configured in such a manner that detected values necessary for offset calculation can be obtained by detection of the synthetic magnetic field artificially generated by the magnetic field generating device by means of the triaxial magnetic sensor. In order to enable the generation of a magnetic field necessary for that purpose, the current is changed. Therefore, the control of the manner of change in current can easily reproduce the change in magnetic field according to the purpose, and can cause the triaxial magnetic sensor to acquire detected values of the synthetic magnetic field. Thus, the offset can be calculated without changing a posture of a portable device.

Therefore, the need to repeat the calibrating operation is eliminated when the offset calculating operation is carried out many times, thereby making it possible to greatly reduce the labor. For example, it is possible to calculate an offset without applying the calibrating operation to the individual portable devices at portable device manufacturing factories, thereby greatly reducing the burden on operators. This enables all of portable devices to be shipped in a state where an offset has been calculated, and users can know an accurate azimuth soon after purchasing a new portable device. When the magnetic field generating device is used for this purpose, the manner of change in current is controlled to generate a synthetic magnetic field in such a manner that a point on the circumference having a radius equal to the intensity of geomagnetism can be detected in the triaxial coordinate system, thereby making it possible to precisely calculate an offset.

Also at development sites for programs for offset calculation, it is possible to calculate an offset even without having many people carry out the calibrating operation after development of a new program. Therefore, the labor necessary for evaluation of the program can be greatly reduced. In the meantime, when the magnetic field generating device of the present invention is used for this purpose, the change in magnetic field can be easily reproduced even in the case of a change in magnetism when users who do not sufficiently understand the meaning of the calibrating operation carry out a calibrating operation which cannot be said to be appropriate for precise offset calculation or in the case where the peripheral environmental magnetic field temporarily changes. Therefore, the magnetic field generating device can be utilized in the development of an offset calculating program.

As described above, the present invention can provide the offset calculating method which can calculate the offset of the triaxial magnetic sensor and the magnetic field generating device which enables this method, without carrying out the calibrating operation.

In the meantime, the term "external magnetic field" means, for example, geomagnetism, a magnetic field generated from a magnetic component present on the periphery of a triaxial Helmholtz coil, or a magnetic field combined thereof.

DETAILED DESCRIPTION OF THE PREFERRED EMBODIMENT

In the magnetic field generating device and the offset calculating method, it is preferable that the current is changed in such a manner that the synthetic magnetic field acts on the triaxial magnetic sensor at least from six directions mutually different in angle by 90° or 180°.

In this case, six detected values of the synthetic magnetic field detected by the triaxial magnetic sensor when acting from the six directions would be present in positions most distant from each other on the azimuth sphere. Therefore, the center point of the azimuth sphere calculated by using these detected values is very highly precise.

It is also preferable that the current is changed in such a manner that the direction of the synthetic magnetic field continuously changes.

In this case, a change in magnetic field similar to that when the calibrating operation is carried out can be reproduced at the inside of the triaxial Helmholtz coil. Therefore, an offset can be effectively calculated by using the offset calculating part designed to calculate an offset when a user carries out the calibrating operation. Also, in the case where a program for calculating an offset when a user carries out the calibrating operation is newly developed, the evaluation of this program can be effectively carried out.

Also, it is preferable that the current flowing through the individual monoaxial Helmholtz coils is changed in such a manner that the synthetic magnetic field acts on the triaxial magnetic sensor at the same intensity from a plurality of predetermined directions.

The geomagnetism changes in level depending on the position on the Earth, but may be considered to basically have the same intensity if the position is not greatly changed. Thus, the current is preferably changed in such a manner that the synthetic magnetic field basically has the same intensity. However, in the development of an offset calculating program intended for use in such an environment that the intensity in magnetic field changes due to some environmental change, there is also a possibility that a magnetic field changed in intensity would be generated according to the purpose.

EXAMPLES

Example 1

Figure 2:
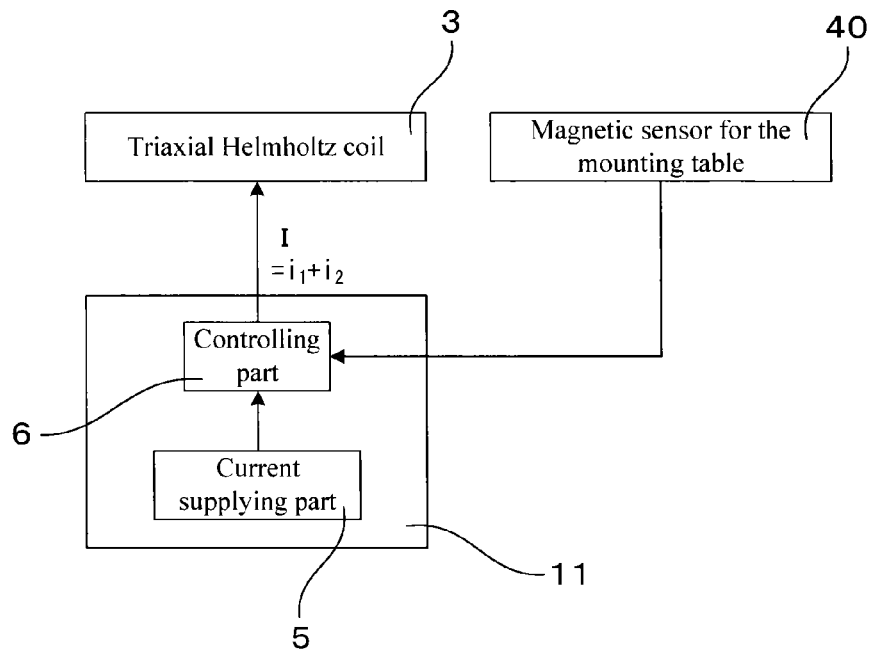
FIG. 2 is a conceptual view of the triaxial Helmholtz coil, a current supplying part and a controlling part in Example 1.
Figure 3:
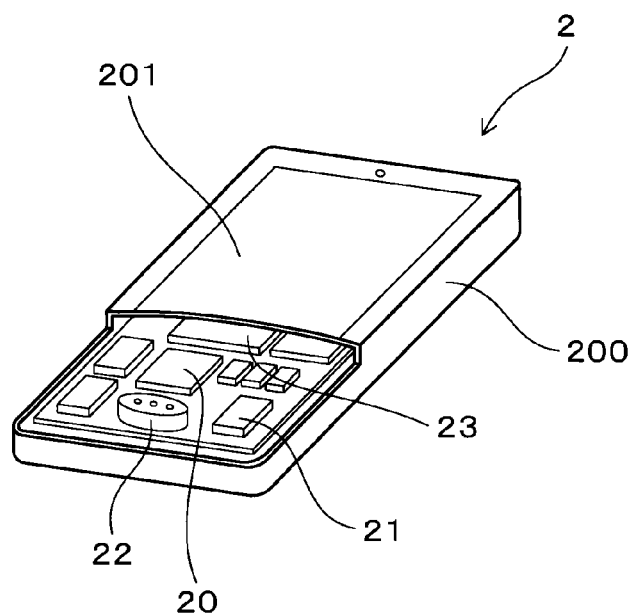
FIG. 3 is a partly-cutaway perspective view of a portable device in Example 1.

Examples relating to the magnetic field generating device and the offset calculating method will be explained by use of FIGS. 1 to 10. A magnetic field generating device 1 of this Example generates a magnetic field which acts on a portable device 2 (see FIGS. 1 and 3). As shown in FIG. 3, the portable device 2 has a triaxial magnetic sensor 20 and an offset calculating part 21. The triaxial magnetic sensor 20 detects geomagnetism as a magnetic vector $OM_e$ within a triaxial orthogonal coordinate system (XYZ: see FIG. 5) fixed in the portable device 2 when a user uses the portable device 2. The offset calculating part 21 calculates a center point O' of an azimuth sphere 7 drawn within the triaxial orthogonal coordinate system by a detected value $M_e$ of geomagnetism along with a change in posture of the portable device 2 when used by the user.

Figure 1:
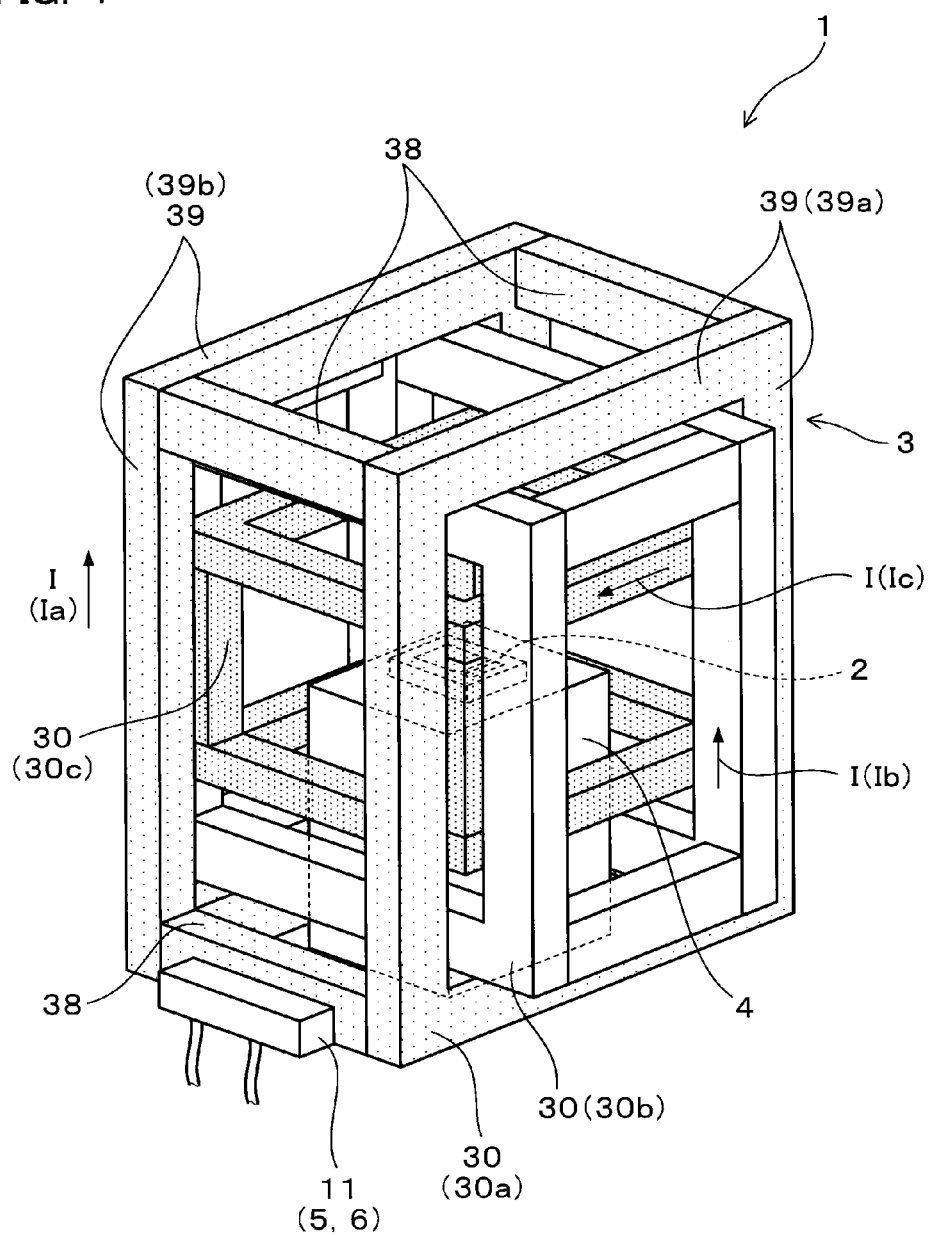
FIG. 1 is a perspective view of a magnetic field generating device having a triaxial Helmholtz coil in Example 1.

As shown in FIG. 1, the magnetic field generating device 1 of this Example includes a triaxial Helmholtz coil 3, a mounting table 4, a current supplying part 5 and a controlling part 6.

The triaxial Helmholtz coil 3 is such that three monoaxial Helmholtz coils 30 through which current flows mutually independently are arranged in such a manner that the center axes of the respective coils are orthogonal to each other.

The mounting table 4 is provided within the triaxial Helmholtz coil 3. The portable device 2 is mounted on the mounting table 4.

The current supplying part 5 supplies the current I to the individual monoaxial Helmholtz coils 30. Also, the controlling part 6 controls the current I (Ia, Ib, Ic) flowing through the individual monoaxial Helmholtz coils 30.

The controlling part 6 is configured to change the current I in such a manner that a synthetic magnetic field, which is synthesized a magnetic field generated by the current I and an external magnetic field, acts on the triaxial magnetic sensor 20 within the portable device 2 mounted on the mounting table 4 from a plurality of predetermined directions. In the meantime, the intensity of the synthetic magnetic field is controlled to be identical regardless of the acting direction and to be approximately equal to the geomagnetism at a measurement place.

As shown in FIG. 1, the triaxial Helmholtz coil 3 has three monoaxial Helmholtz coils 30: a large-size monoaxial Helmholtz coil 30a, a medium-size monoaxial Helmholtz coil 30b and a small-size monoaxial Helmholtz coil 30c. The large-size monoaxial Helmholtz coil 30a includes a pair of coil frames 39 (39a, 39b) in which a conductor wire (not shown) is wound and connecting frames 38 which connect the pair of coil frames 39a, 39b. Since the pair of coil frames 39a, 39b is arranged to be apart from each other with a predetermined interval, a uniform magnetic field is generated in a predetermined position within the triaxial Helmholtz coil 3.

The medium-size monoaxial Helmholtz coil 30b and the small-size monoaxial Helmholtz coil 30c have a structure similar to that of the large-size monoaxial Helmholtz coil 30a. The three monoaxial Helmholtz coils 30 are such that the center axes of the individual coil frames 39 (winding center axes) are orthogonal to each other. Such a configuration is employed that the intensity and three-dimensional direction of the magnetic field generated within the triaxial Helmholtz coil 3 can be freely determined by controlling the current I flowing through the respective monoaxial Helmholtz coils 30.

In this Example, the portable device 2 is arranged in a position where the center axes of the three monoaxial Helmholtz coils 30 intersect. Such a configuration is employed that a uniform magnetic field generated at the inside of the triaxial Helmholtz coil 3 acts on the triaxial magnetic sensor 20 within the portable device 2 mounted on the mounting table 4.

Also, a control box 11 is arranged next to the triaxial Helmholtz coil 3. The current supplying part 5 and the controlling part 6 are provided within the control box 11. As shown in FIG. 2, the current I controlled by the controlling part 6 includes main current i1 and cancel current i2. The cancel current i2 is current for generating a cancel magnetic field which cancels the external magnetic field which is geomagnetism. Also, the main current i1 is current for generating a net magnetic field (synthetic magnetic field) which acts on the triaxial magnetic sensor 20. The controlling part 6 supplies the current I including a combination of these main current i1 and cancel current i2 to the respective monoaxial Helmholtz coils 30. Such a configuration is employed that the magnetic field which acts on the triaxial magnetic sensor 20 can be changed with time by changing the main current it flowing through the respective monoaxial Helmholtz coils.

Figure 7:
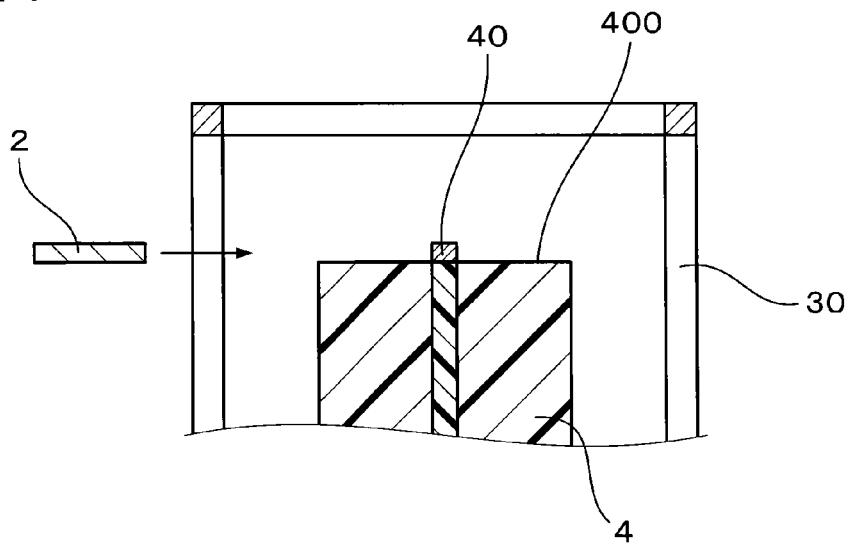
FIG. 7 is a view showing a state immediately before the portable device is mounted on a mounting table in Example 1.
Figure 8:
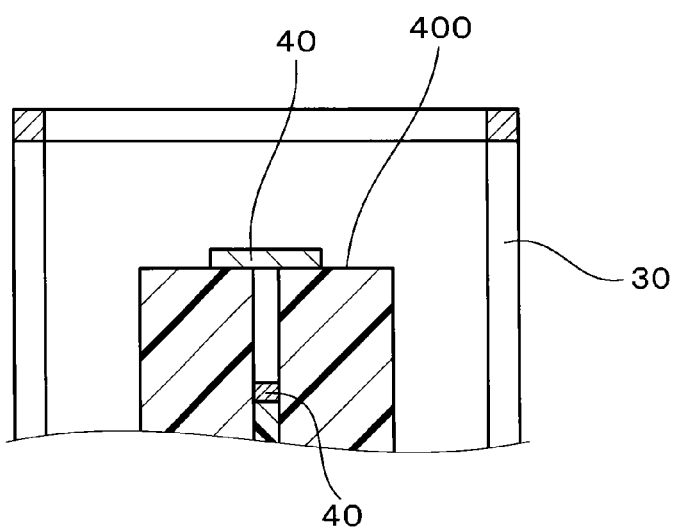
FIG. 8 is a view showing a state after the portable device has been mounted on the mounting table in Example 1.

As shown in FIG. 2, the controlling part 6 is connected to a magnetic sensor 40 for the mounting table. The magnetic sensor 40 for the mounting table is provided on the mounting table 4 in such a manner that the sensor can be moved up and down, as shown in FIG. 7. In this Example, before mounting of the portable device 2 on the mounting table 4, the magnetic sensor 40 for the mounting table is protruded from a mounting surface 400 in a state where no current is supplied to the respective monoaxial Helmholtz coils 30, thereby measuring the external magnetic field. Thereafter, the portable device 2 is mounted while the magnetic sensor 40 for the mounting table is housed within the mounting table 4 as shown in FIG. 8. The controlling part 6 calculates the amount of the cancel current i2 which can accurately cancel the measured external magnetic field, and the current I including a combination of the calculated cancel current i2 and the main current i1 is supplied to the respective monoaxial Helmholtz coils 30. The external magnetic field is cancelled by the cancel magnetic field generated by the cancel current i2, and the magnetic field (synthetic magnetic field) generated by the main current i1 acts on the triaxial magnetic sensor 20. In the meantime, the relationship between the value of the main current i1 and the level of the synthetic magnetic field generated on the mounting table 4 may be confirmed in advance, and the main current i1 is caused to supply according to the level of the magnetic field to be generated.

Next, the structure of the portable device 2 will be explained. As shown in FIG. 3, the portable device 2 includes a main body case 200 and a display device 201. Within the main body case 200, electronic components such as a microphone 22 and a storage device 23 are housed in addition to the triaxial magnetic sensor 20 and the offset calculating part 21. Since the triaxial magnetic sensor 20 is affected by the magnetic field generated from these electronic components, the center point O' of the azimuth sphere 7 (see FIG. 5) deviates from the original point O. For example, even in the case where no magnetic field is present on the periphery of the portable device 2, the magnetic field for O' is detected.

Figure 4:
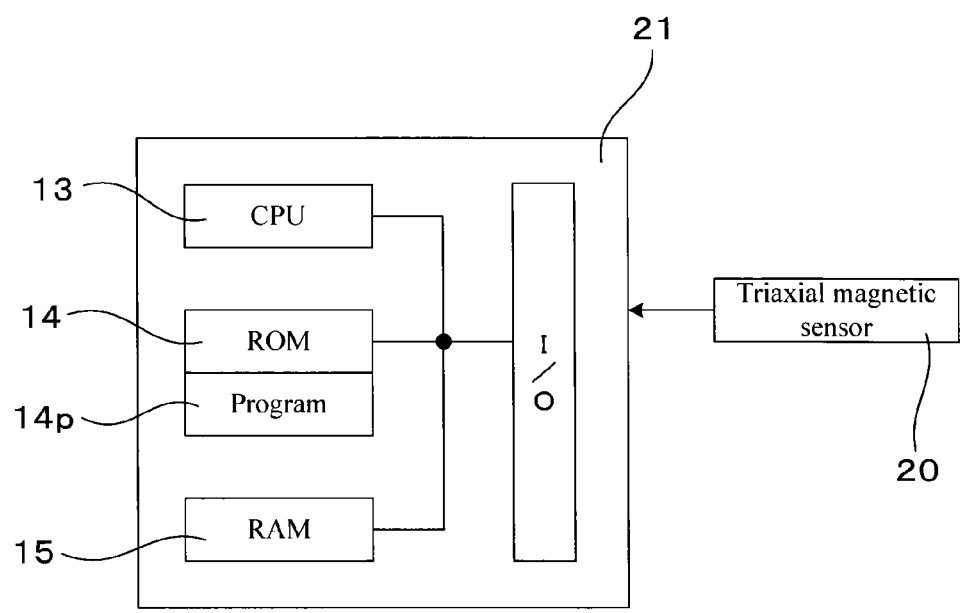
FIG. 4 is a conceptual view of an offset calculating part in Example 1.

As shown in FIG. 4, the offset calculating part 21 includes a CPU 13, an ROM 14, an RAM 15 and the like. The ROM 14 stores a program 14p for offset calculation therein. The CPU 13 reads out and executes this program 14p, thereby calculating an offset of the triaxial magnetic sensor 20.

Figure 10:
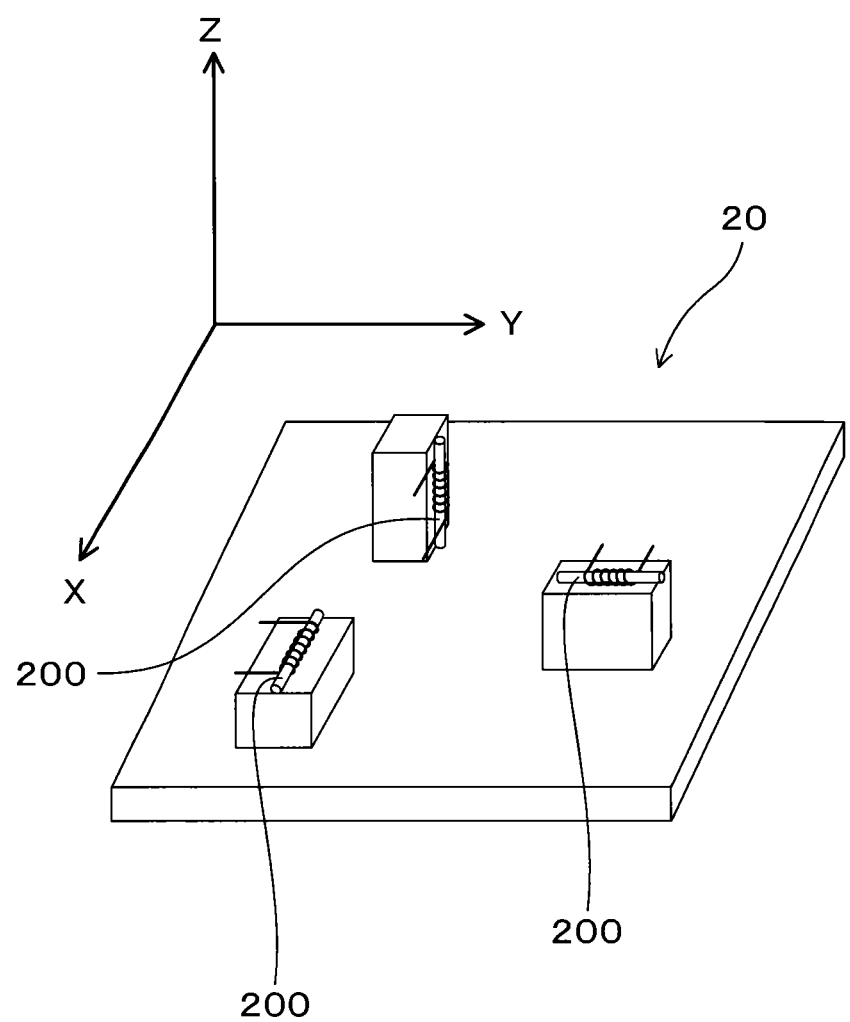
FIG. 10 is a perspective view of the triaxial magnetic sensor in Example 1.

Also, the triaxial magnetic sensor 20 of this Example is composed of magneto-impedance sensor elements 200 as shown in FIG. 10. In this Example, the triaxial magnetic sensor 20 is formed by arranging three magneto-impedance sensor elements 200 so that the respective magnetism sensing directions are oriented to the triaxial directions (X, Y and Z axial directions) orthogonal to each other.

Figure 5:
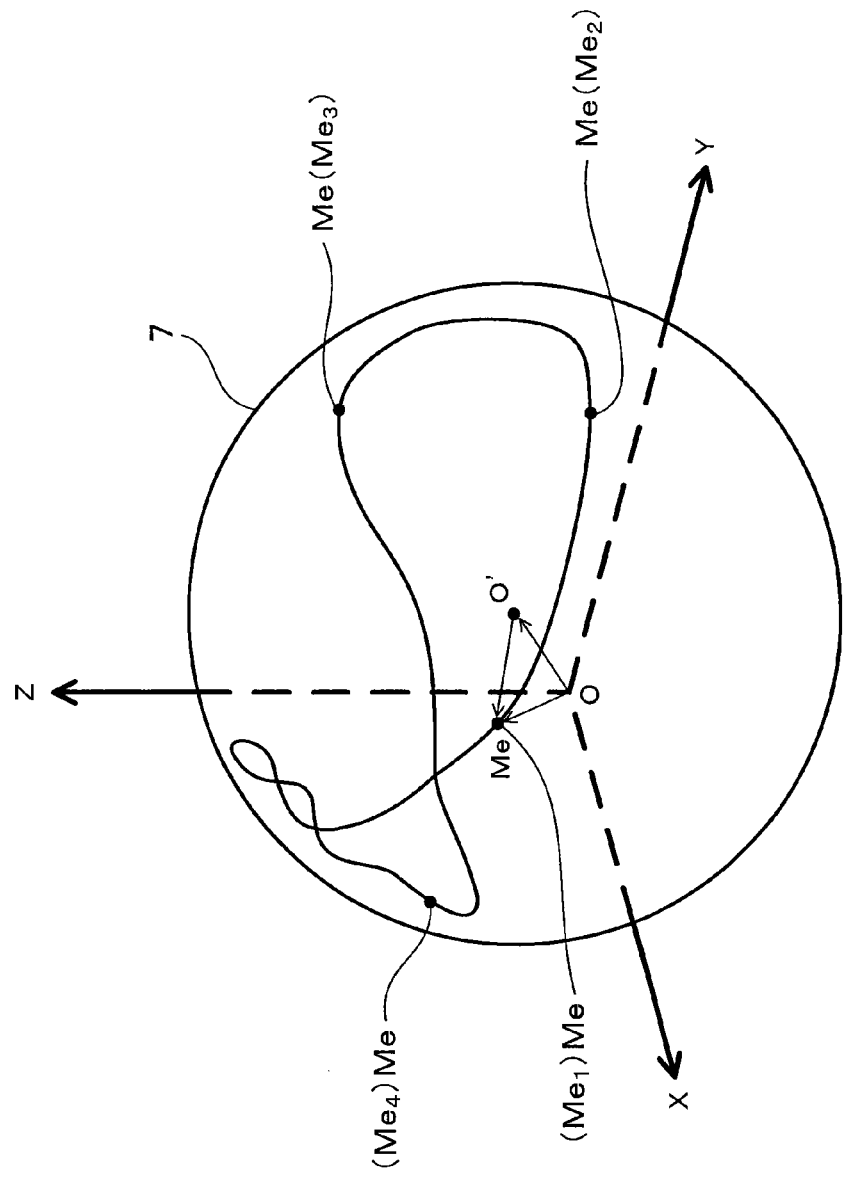
FIG. 5 is a view showing, on an azimuth sphere, detected values of geomagnetism obtained by a triaxial magnetic sensor when a user carries out a calibrating operation in Example 1.

Next, the calibrating operation will be explained by use of FIG. 5. A user, when carrying out the calibrating operation, subjects the portable device 2 to a rotating operation such as a front-back reverse operation in a manner of drawing a figure of eight. This operation changes a relative direction of geomagnetism based on the portable device 2. At this time, the detected value $M_e$ of the geomagnetism obtained by the triaxial magnetic sensor 20 moves on the azimuth sphere 7 as shown in FIG. 5, for example. The program 14p stored in the ROM 14 selects four detected values $M_e$ ($M_{e1}$, $M_{e2}$, $M_{e3}$, $M_{e4}$) as far from each other as possible on the azimuth sphere 7 from the acquired detected values during the calibrating operation. Such a configuration is employed that these selected four detected values $M_e$ are used to calculate an equation for the azimuth sphere 7 and thus to calculate the coordinates of the center point O'.

In the meantime, while an offset has been calculated using the selected four detected values in this Example, the number of the detected values used in calculation of an offset varies depending on the program 14p to be applied. For example, when the case where the azimuth sphere is formed into an ellipse is considered, at least six detected values are required, as described in JP 2012-168140 A. Also, it is possible to apply various techniques proposed in prior art documents, such as the technique of acquiring more detected values and calculating an offset using the method of least squares.

Figure 6:
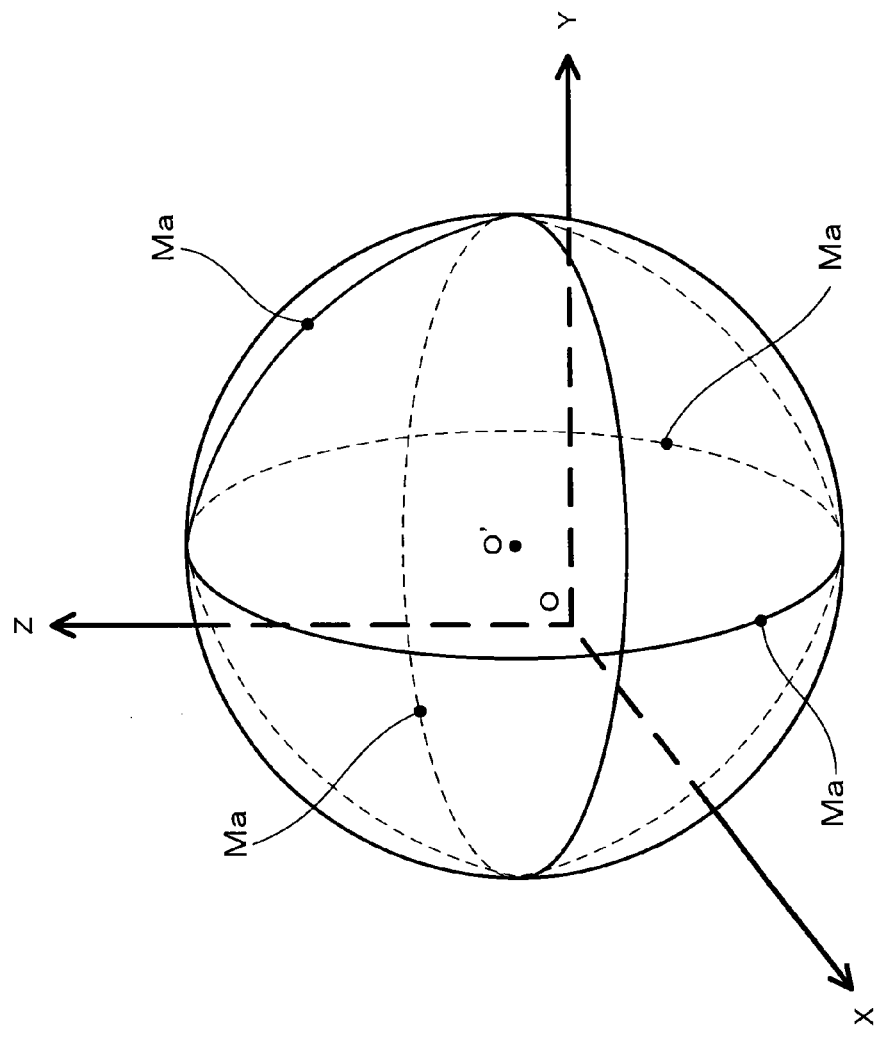
FIG. 6 is a view showing positions of the detected values of a synthetic magnetic field in the triaxial orthogonal coordinate system in Example 1.

In this Example, the portable device 2 is mounted on the mounting table 4 (see FIG. 1), and the synthetic magnetic field generated at the inside of the triaxial Helmholtz coil 3 based on the preliminarily-prepared magnetic field change pattern is caused to act on this portable device 2. Then, a plurality of detected values $M_a$ are obtained, and at least four detected values $M_a$ of the synthetic magnetic field, which are as far from each other as possible on the azimuth sphere 7 and are not present in the same plane, are selected by the program 14p from the obtained detected values $M_a$ as shown in FIG. 6. Also, in this Example, the synthetic magnetic field is caused to act on the triaxial magnetic sensor 20 at the same intensity. Therefore, all of the selected four detected values $M_a$ are equal in terms of the distance from the center point O' of the azimuth sphere 7. Thus, the coordinates of the center point O' can be calculated by solving the simultaneous equation of the sphere using the obtained plurality of detected values $M_a$. In the meantime, the preliminarily-prepared magnetic field change pattern can be produced, for example, by preliminarily acquiring the magnetic field change data to be obtained when a user takes out the portable device from a pocket, or turns in another direction while having the portable device in a pocket.

Figure 9:
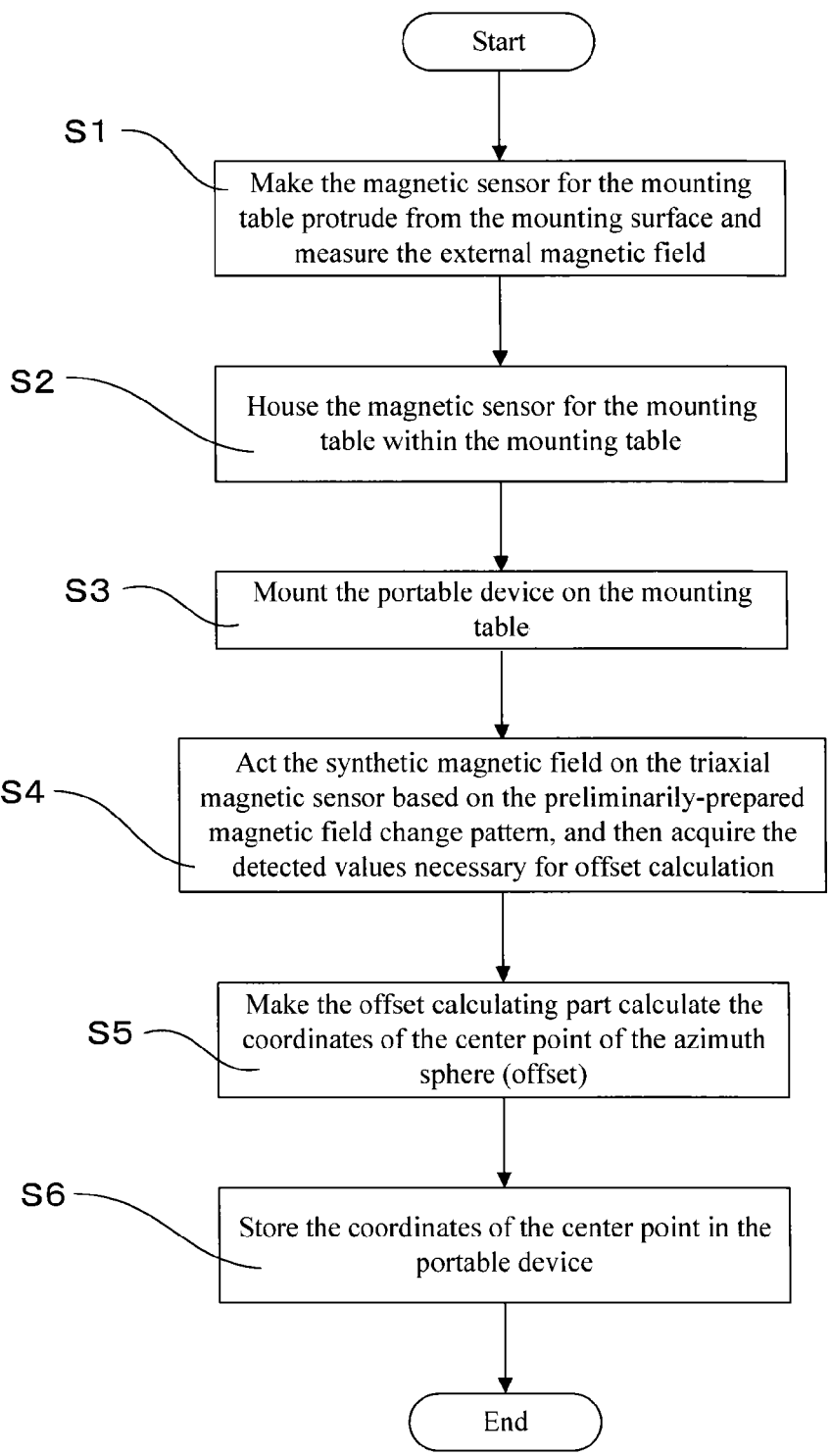
FIG. 9 is a flowchart of an offset calculating method in Example 1.

Next, the offset calculating method of this Example will be explained using the flowchart shown in FIG. 9. At first, in this Example, the magnetic sensor 40 for the mounting table is protruded from the mounting surface 400 (see FIG. 7) of the mounting table 4 in a state where the current I is not caused to flow through the triaxial Helmholtz coil 3 to measure the external magnetic field on the mounting surface 400 (Step S1). Thereafter, the magnetic sensor 40 for the mounting table is housed within the mounting table 4 (see Step S2, FIG. 8).

Next, the portable device 2 is mounted on the mounting table 4 (mounting step: Step S3). The current I is caused to flow through the individual monoaxial Helmholtz coils 30, and also is changed based on the preliminarily-prepared magnetic field change pattern to cause the synthetic magnetic field to act on the triaxial magnetic sensor 20. Then, the detected values $M_a$ necessary for offset calculation are acquired (current changing step and detected value acquiring step; Step S4). Namely, the cancel current i2 is supplied so as to cause the generation of a cancel magnetic field which accurately cancels the external magnetic field measured in the Step S1, and the main current i1 which generates a net magnetic field (synthetic magnetic field) which acts on the triaxial magnetic sensor 20 is caused to flow through the respective monoaxial Helmholtz coils 30.

The offset calculating part 21 within the portable device 2 is caused to acquire a plurality of detected values $M_a$ and to calculate an offset using the program 14p stored in the ROM 14 possessed by the offset calculating part 21 (calculating step; Step S5). Next, the calculated offset is stored in the RAM 15 of the portable device 2 (see FIG. 4) (Step S6; storing step).

The information of the stored offset is utilized when a user uses the portable device 2. Namely, the portable device 2 when used by the user assigns an actual measurement vector $\vec{OM_e}$ of the geomagnetism measured by the triaxial magnetic sensor 20 (see FIG. 5) and an offset vector $\vec{OO'}$ into the following equation to calculate a geomagnetic vector $\vec{O'M_e}$ which is not affected by the internal magnetic field of the portable device 2. The calculated geomagnetic vector $\vec{O'M_e}$ is used to calculate the azimuth in which the portable device 2 is directed, thereby displaying the azimuth on the display device 201 (see FIG. 3) and displaying map information in accordance with the direction thereof.

[Mathematical Formula 2]

$$\vec{O'M_e} = \vec{OM_e} - \vec{OO'} \quad \text{(Formula 2)}$$

The effects of this Example will now be explained. This Example utilizes a change in direction of the synthetic magnetic field generated at the inside of the triaxial Helmholtz coil 3 in place of the calibrating operation, namely, the operation of changing a relative direction of geomagnetism based on the portable device 2. Therefore, an offset can be calculated without the calibrating operation.

Namely, in this Example, the synthetic magnetic field which changes with time is generated within the triaxial Helmholtz coil 3 by changing the current supplied to the respective monoaxial Helmholtz coils 30. This causes the triaxial magnetic sensor 20 to acquire detected values $M_a$ of the synthetic magnetic field necessary for offset calculation. Also, the current I is changed in such a manner that the intensity of the synthetic magnetic field does not change. Therefore, it is possible to cause the triaxial magnetic sensor 20 to acquire a plurality of detected values $M_a$ of the synthetic magnetic field all of which are equally distant from the center point O' of the azimuth sphere 7 and are apart from each other on the azimuth sphere 7. The plurality of detected values $M_a$ can be used to calculate an offset based on the program 14p stored in the ROM 14. Thus, it is made possible to calculate an offset without changing a posture of the portable device 2.

Therefore, the need to repeat the calibrating operation when the operation of calculating an offset is carried out many times is eliminated, thereby making it possible to greatly reduce the labor. For example, it is possible to calculate an offset without applying the calibrating operation to the individual portable devices 2 at factories for manufacturing the portable devices 2, thereby greatly reducing the burden on operators. This enables the portable devices 2 to be shipped in a state where an offset has been calculated and stored, which has been considered to be difficult to carry out due to great burden, and users can know an accurate azimuth soon after purchasing a new portable device 2.

Also, in this Example, the current I flowing through the individual monoaxial Helmholtz coils 30 is changed in such a manner that the direction of the synthetic magnetic field continuously changes.

Therefore, a change in magnetic field which is similar to that caused when the calibrating operation is carried out can be reproduced by the triaxial Helmholtz coil 3. Therefore, an offset can be effectively calculated by using the offset calculating part 21 designed to calculate an offset when a user carries out the calibrating operation.

This Example can provide an offset calculating method which can calculate an offset of the triaxial magnetic sensor without carrying out the calibrating operation and a magnetic field generating device which enables this method, as described above.

In the meantime, the intensity of the synthetic magnetic field has been defined as being the same as that of the geomagnetism in this Example, but the present invention is not limited to this. Specifically, the intensity of the synthetic magnetic field may be made stronger or weaker than that of the geomagnetism within the range of intensity which can be detected by the triaxial magnetic sensor. Also, in the case where a program 14p which can adapt to a special magnetic field environment is developed, it is also possible to intentionally change the magnetic field with time, not to maintain the magnetic field at the same intensity.

Also, although the external magnetic field has been canceled by using the cancel current i2 (see FIG. 2) in this Example, the present invention is not limited to this. Specifically, the external magnetic field may be shielded by using a shielding member (not shown). In this case, it is not necessary to supply the cancel current i2.

Example 2

Figure 11:
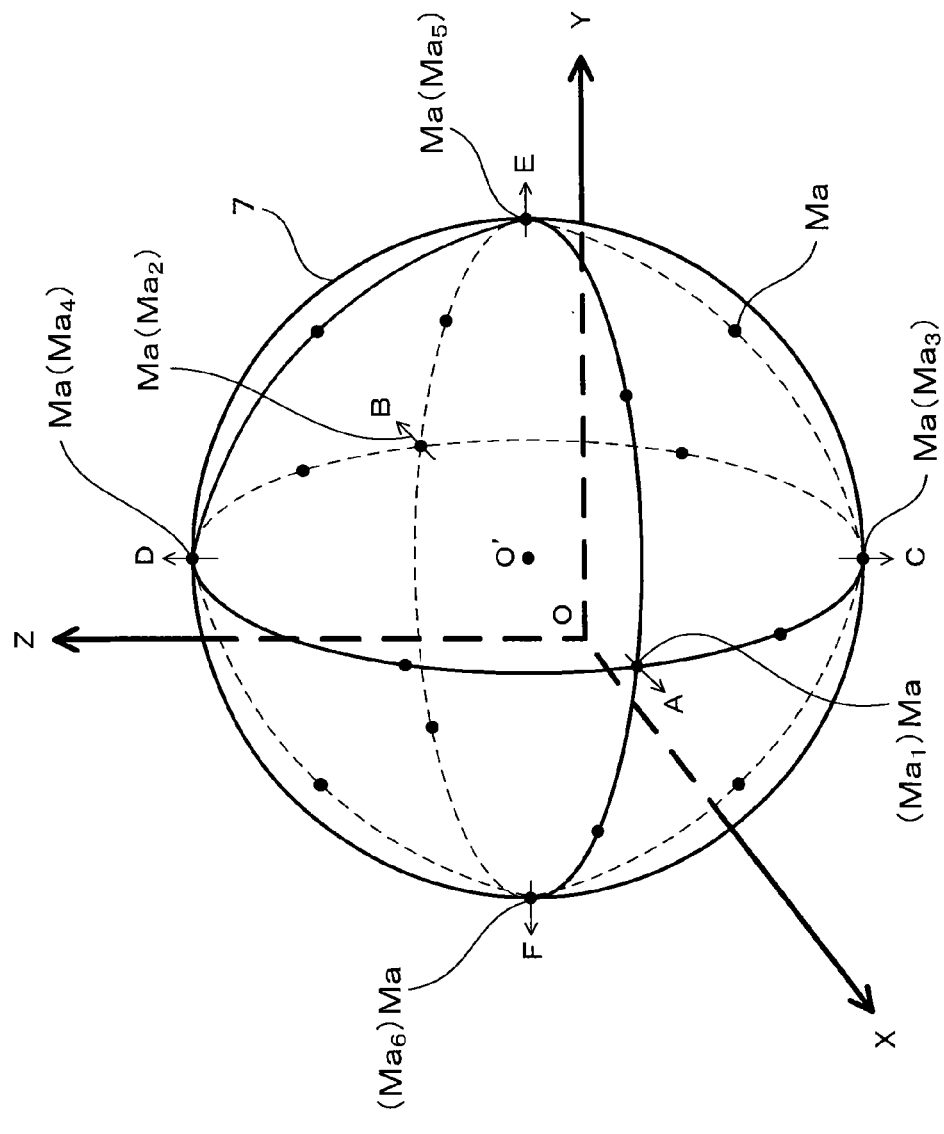
FIG. 11 is a view showing positions of detected values of a synthetic magnetic field in a triaxial orthogonal coordinate system in Example 2.

This Example is an example wherein the number of detected values $M_a$ of the synthetic magnetic field is changed. As shown in FIG. 11, in this Example, the direction of the synthetic magnetic field is changed so as to rotate by 360° around the X, Y and Z axes, respectively. One detected value $M_a$ is acquired each time the direction of the synthetic magnetic field rotates by 45° so that eight detected values $M_a$ for the respective one axis, namely, twenty four detected values $M_a$ for the three axes, in total, are acquired. The thus-acquired detected values $M_a$ are apart from each other on the azimuth sphere 7, and are evenly present on the azimuth sphere 7. Therefore, the coordinates of the center point O' on the azimuth sphere 7 can be precisely calculated by using the detected values $M_a$.

The configuration as described above enables the synthetic magnetic field to act on the triaxial magnetic sensor 20 so as to include six directions (A, B, C, D, E, F) mutually different in angle by 90° or 180°. Therefore, the detected values $M_a$ of the triaxial magnetic sensor 20 can be acquired for the six directions. Thus, six detected values $M_a$ ($M_{a1}$, $M_{a2}$, $M_{a3}$, $M_{a4}$, $M_{a5}$, $M_{a6}$) which are most distant from each other on the azimuth sphere 7 can be acquired, thereby making it possible to realize very high calculation accuracy.

Additionally, this Example has configuration and effects similar to those of Example 1.

Example 3

This Example is an example wherein a method of using the magnetic field generating device 1 is changed. In this Example, after new development of the program 14p for offset calculation (see FIG. 4), the magnetic field generating device 1 is used when this program is evaluated.

As explained in Example 1, a user, when carrying out the calibrating operation, subjects the portable device 2 to the rotating operation such as the front-back reverse operation in a manner of drawing a figure of eight. This operation changes the direction of the portable device 2 to the geomagnetism. At this time, the detected value $M_e$ of the geomagnetism obtained by the triaxial magnetic sensor 20 changes as shown in FIG. 5, for example, and moves on the azimuth sphere 7 along with a change in posture of the portable device 2. The offset calculating part 21 acquires detected values $M_e$ of the geomagnetism at a plurality of points during the calibrating operation, and calculates the center point O' of the azimuth sphere 7 using these detected values.

Also, the magnetic field generating device 1 of the present invention is not intended for offset calculation itself, but can be effectively utilized also for the development of a program 14p for calculating an offset. Specifically, the program 14p for offset calculation is stored in the ROM 14, and the program 14p stored in the ROM 14 can also be evaluated by using the magnetic field generating device 1 by reproducing a change in magnetic field, which is considered to act on the triaxial magnetic sensor 20 during the calibrating operation, for example. Specifically, the way of the calibrating operation varies depending on, for example, whether or not a user understands why the calibrating operation is required, and also varies from person to person. Therefore, the loci of the detected values $M_a$ on the azimuth sphere 7 vary from person to person. Thus, it is necessary to develop a program 14p which can accurately calculate an offset even if the way of the calibrating operation changes. For example, during the calibrating operation, some people bend backward their wrist of the hand which holds the portable device 2 incompletely so that an offset is hard to be accurately calculated. Thus, also in such a case, it is necessary, for example, to confirm to what extent the reduction in calculation accuracy can be suppressed.

Conventionally, when a plurality of programs 14p has to be verified, a person has to carry out the calibrating operation for each of the programs 14p, which is a great burden. However, in the magnetic field generating device 1 of the present invention, a plurality of programs 14p can be evaluated without carrying out the calibrating operation once the magnetic field change pattern during the calibrating operation is stored.

Figure 12:
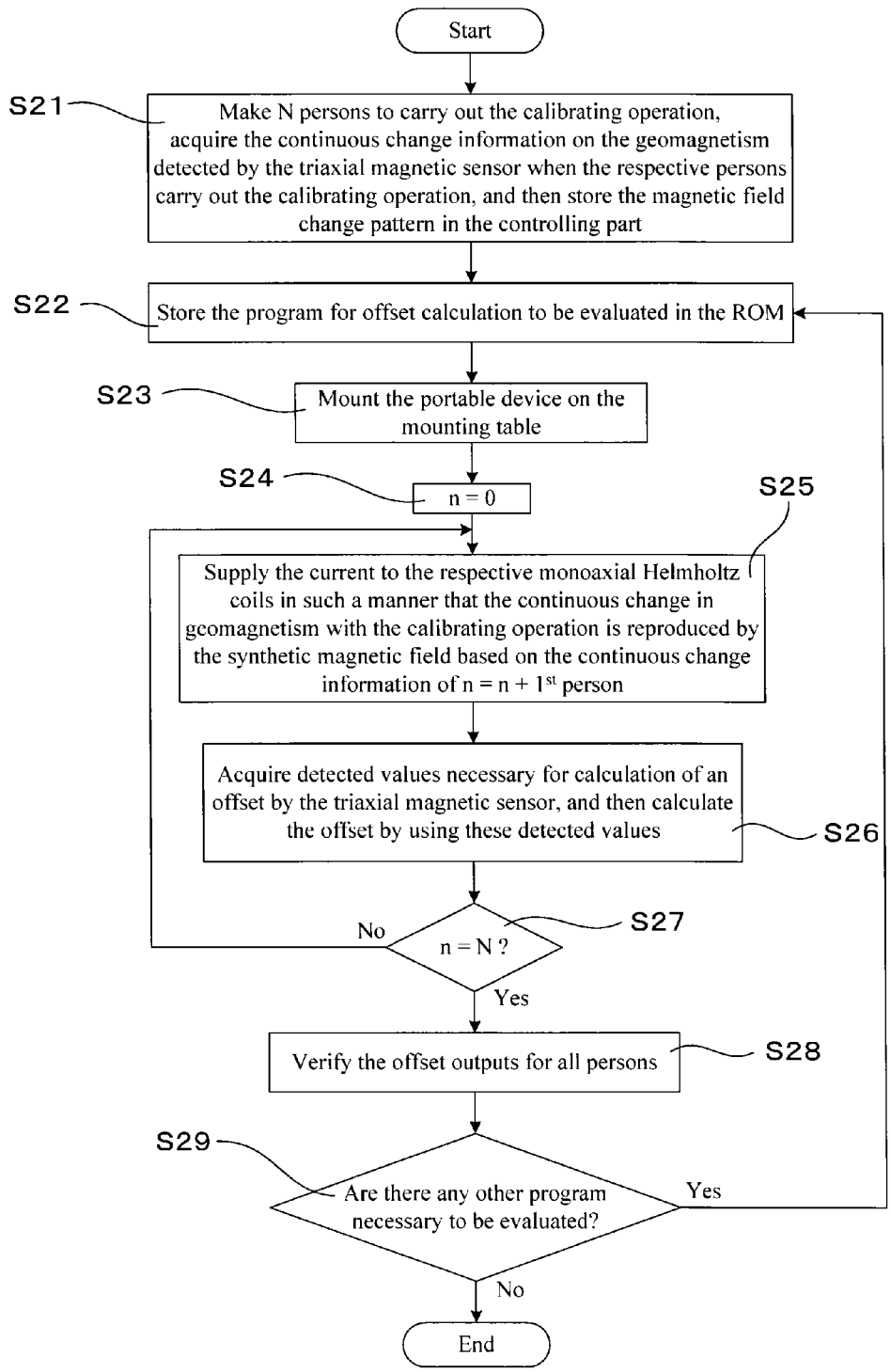
FIG. 12 is a flowchart when an offset calculating program is evaluated in Example 3.
Figure 13:
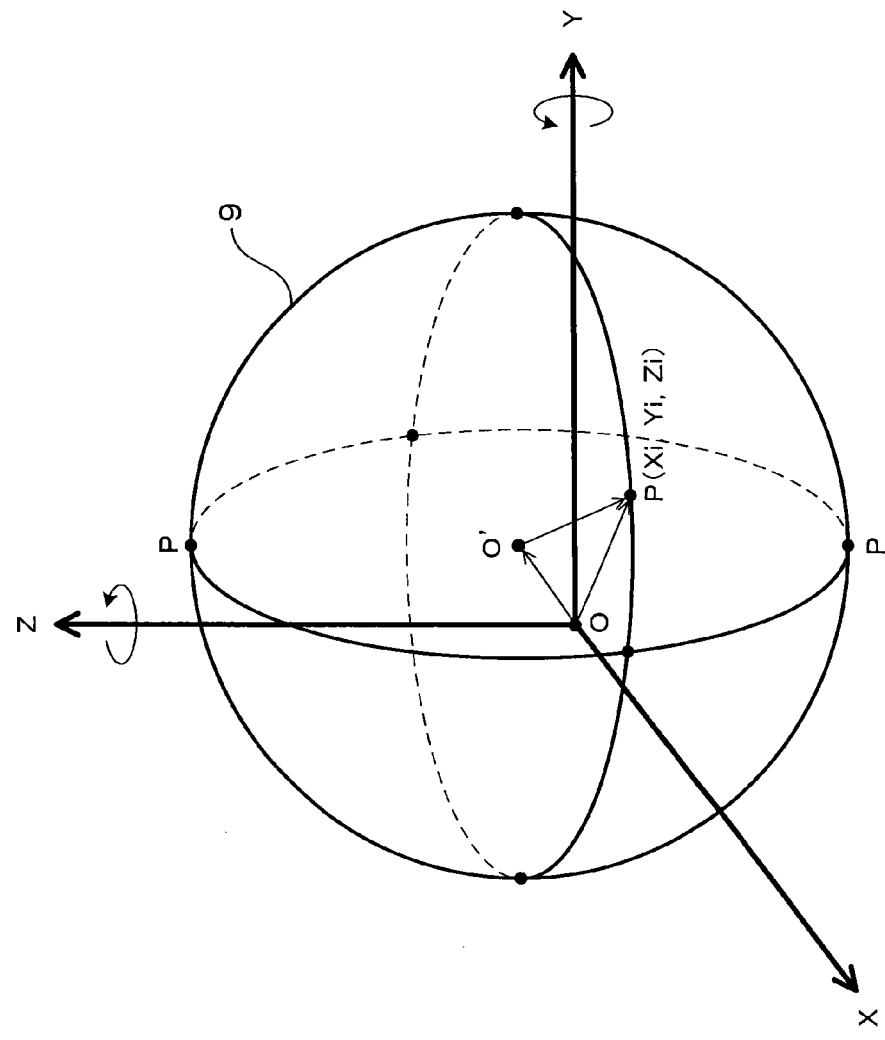
FIG. 13 is a view showing, on the azimuth sphere, a detected value of geomagnetism when a portable device is subjected to a rotating operation in a conventional example.

As shown in the flowchart in FIG. 12, in this Example, N persons are made to carry out the calibrating operation to acquire the continuous change information (magnetic field change pattern) on the geomagnetism detected by the triaxial magnetic sensor 20 when the respective persons carry out the calibrating operation. This magnetic field change pattern for the N persons is stored in the controlling part 6 (see FIG. 2) (Step S21). The newly-developed program 14p for offset calculation is stored in the ROM 14 (see FIG. 4) (Step S22).

Next, the portable device 2 is mounted on the mounting table 4 (Step S23). The step moves to Step S24 in which n is set to be 0. Thereafter, Step S25 is executed. The current I is caused to flow through the respective monoaxial Helmholtz coils 30 in such a manner that the synthetic magnetic field reproduce the continuous change in geomagnetism detected by the triaxial magnetic sensor 20 when the $n^{th}$ person carries out the calibrating operation. The step then moves to Step S26. A necessary number of detected values $M_a$ are acquired by the triaxial magnetic sensor 20 based on the detected value acquiring method of the program 14p to be evaluated. These detected values $M_a$ are used to cause the program 14p to calculate an offset.

Steps S25 to S27 are repeated to acquire the results of calculation of the offset for the N persons obtained when the calibrating operation is carried out. Then, the step moves to Step S28. Here, the obtained data on the offset for the N persons is verified to confirm what level of difference occurs in the accuracy of the offset value obtained by the program 14p depending on persons who carry out the calibrating operation.

Thereafter, the step moves to Step S29 to judge whether any other programs 14p necessary to be evaluated are present or not. Here, when it is judged that a program 14p to be evaluated using the same magnetic field change pattern is present, the step returns to Step S22. A plurality of programs 14p are continuously evaluated by repeating Steps S22 to S28.

The effects of this Example will then be explained. According to the configuration as described above, in Step S21, if N persons are made to carry out the calibrating operation only once, the change in geomagnetism which is similar to that caused when the calibrating operation is carried out can be reproduced by the synthetic magnetic field without carrying out the calibrating operation again (Step S25). Therefore, in the case where a plurality of programs 14p is evaluated by carrying out the same calibrating operation, the need to ask a plurality of persons to carry out the calibrating operation many times is eliminated. Therefore, the labor required for evaluation of the programs 14p can be greatly reduced.

What is claimed is:

1. A magnetic field generating device which generates a magnetic field acting on a portable device, the portable device having a triaxial magnetic sensor which detects geomagnetism as a magnetic vector within a triaxial orthogonal coordinate system fixed on the portable device, and an offset calculating part which calculates a center point of an azimuth sphere drawn within the triaxial orthogonal coordinate system by the detected values of the geomagnetism along with a change in posture of the portable device, and the magnetic field generating device comprising:

a triaxial Helmholtz coil where three monoaxial Helmholtz coils through which current flows mutually independently are arranged in such a manner that the center axes of the respective coils are orthogonal to each other;

a mounting table which is provided within the triaxial Helmholtz coil and on which the portable device is mounted;

a current supplying part which supplies current to the individual monoaxial Helmholtz coils; and a controlling part which controls the current, wherein the controlling part is configured to change the current in such a manner that a synthetic magnetic field, which is synthesized from a magnetic field generated by the current and an external magnetic field, acts on the triaxial magnetic sensor within the portable device mounted on the mounting table from a plurality of predetermined directions.

2. The magnetic field generating device according to claim 1, wherein the controlling part changes the current in such a manner that the synthetic magnetic field acts on the triaxial magnetic sensor at least from six directions mutually different in angle by 90° or 180°.

3. The magnetic field generating device according to claim 1, wherein the controlling part changes the current in such a manner that the direction of the synthetic magnetic field continuously changes.

4. The magnetic field generating device according to claim 1, wherein the controlling part changes the current flowing through the individual monoaxial Helmholtz coils in such a manner that the synthetic magnetic field acts on the triaxial magnetic sensor at the same intensity from a plurality of predetermined directions.

5. A method for calculating an offset of a triaxial magnetic sensor provided in a portable device, the portable device having the triaxial magnetic sensor which detects geomagnetism as a magnetic vector within a triaxial orthogonal coordinate system fixed on the portable device, and an offset calculating part which calculates a center point of an azimuth sphere drawn within the triaxial orthogonal coordinate system by the detected values of the geomagnetism along with a change in posture of the portable device, and the method comprising:

a mounting step of mounting the portable device on a mounting table provided within the triaxial Helmholtz coil wherein three monoaxial Helmholtz coils through which current flows mutually independently are arranged in such a manner that the center axes of the respective coils are orthogonal to each other;

a current changing step of changing the current flowing through the individual monoaxial Helmholtz coils in such a manner that a synthetic magnetic field, which is synthesized from a magnetic field generated by the current and an external magnetic field, acts on the triaxial magnetic sensor within the portable device mounted on the mounting table from a plurality of predetermined directions;

a detected value acquiring step of detecting the synthetic magnetic field whose direction changes during the current changing step by means of the triaxial magnetic sensor in order to acquire detected values of the synthetic magnetic field necessary for calculation of the offset; and a calculating step of calculating an offset by the offset calculating part using the obtained detected values of the synthetic magnetic field.

6. The offset calculating method according to claim 5, wherein, in the current changing step, the synthetic magnetic field acts on the triaxial magnetic sensor at least from six directions mutually different in angle by 90° or 180°.

7. The offset calculating method according to claim 5, wherein, in the current changing step, the current changes in such a manner that the direction of the synthetic magnetic field continuously changes.

8. The offset calculating method according to claim 5, wherein, in the current changing step, the current flowing through the individual monoaxial Helmholtz coils is changed in such a manner that the synthetic magnetic field acts on the triaxial magnetic sensor at the same intensity from a plurality of predetermined directions.

* * * * *